United States Patent [19]

Tinker et al.

[11] Patent Number: 4,625,126
[45] Date of Patent: Nov. 25, 1986

[54] CLOCK GENERATOR FOR PROVIDING NON-OVERLAPPING CLOCK SIGNALS

[75] Inventors: Darrell E. Tinker, Mountainview; Shyam Dujari, San Jose, both of Calif.

[73] Assignee: Zilog, Inc., Campbell, Calif.

[21] Appl. No.: 626,378

[22] Filed: Jun. 29, 1984

[51] Int. Cl.$^4$ .......................... H03K 5/05; H03K 5/15; H03K 5/26; H03K 17/13
[52] U.S. Cl. .................................... 307/262; 307/269; 307/279; 307/453; 307/481
[58] Field of Search ............... 307/262, 269, 453, 601, 307/602, 603, 605, 608, 511, 513, 279, 355, 594, 481; 328/55, 56; 377/79, 105

[56] References Cited

U.S. PATENT DOCUMENTS

| | | | |
|---|---|---|---|
| 3,479,523 | 11/1969 | Pleshko | 307/453 X |
| 4,045,685 | 8/1977 | Gehrig | 307/269 X |
| 4,179,628 | 12/1979 | Ohgishi et al. | 307/448 X |
| 4,230,951 | 10/1980 | Suzuki et al. | 307/269 X |
| 4,296,339 | 10/1981 | Murotani | 307/475 X |
| 4,317,053 | 2/1982 | Shaw et al. | 307/269 |
| 4,456,837 | 6/1984 | Schade, Jr. | 307/269 X |
| 4,472,645 | 9/1984 | White | 307/453 X |
| 4,494,021 | 1/1985 | Bell et al. | 307/601 X |
| 4,547,684 | 10/1985 | Pechar | 307/269 X |

OTHER PUBLICATIONS

"Schmitt Trigger Prevents Clock Train Overlap" by R. R. Osborn, *Electronics*, Jul. 3, 1972.

"A Single-Chip Two-Phase Clock" in *Electronic Engineering*, Dec. 1978.
"Non-Overlapping Clock Generator" by Cases, Moore and Thoma, *IBM Technical Disclosure Bulletin*, vol. 24, No. 3, Aug. 1981.

*Primary Examiner*—Stanley D. Miller
*Assistant Examiner*—David R. Bertelson
*Attorney, Agent, or Firm*—Majestic, Gallagher, Parsons & Siebert

[57] ABSTRACT

The non-overlap clock circuit of this invention is responsive to a variable input signal for producing a first and second output signal that vary respectively with phases opposite to and the same as the input signal. The circuit comprises a NOR-gate with its first input connected to the variable signal input and its second input to the second signal output of the circuit. The output of the NOR-gate is the first signal output of the circuit. The circuit includes a first means such as an enhancement type FET having a gate and a main current path. The gate is supplied with a first output signal of the circuit and the main current path is connected between ground and the second signal output of the circuit. A second means such as a depletion type FET is also employed with its main current path connected between the variable signal input and the second signal output of the circuit. The second signal output of the circuit is thus driven by the variable input signal through the main current path of the second means. The two output signals provided by the circuit do not overlap and will not simultaneously exceed a predetermined signal level.

1 Claim, 19 Drawing Figures

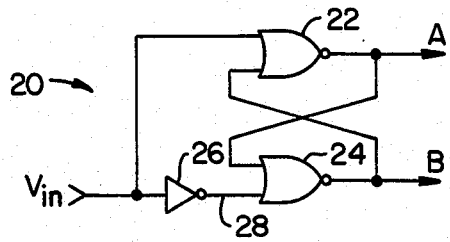
FIG._1. PRIOR ART
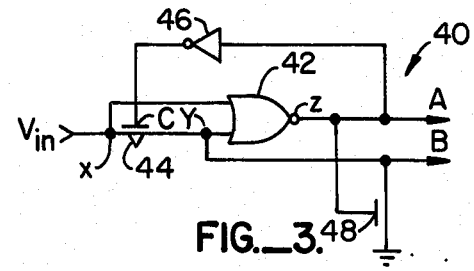
FIG._3.
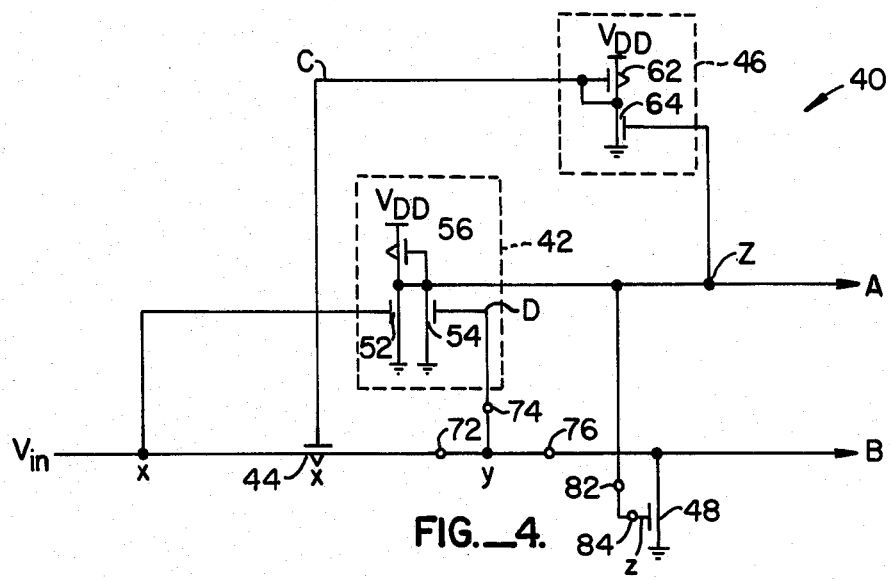
FIG._4.
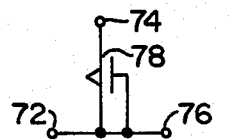
FIG._6A.
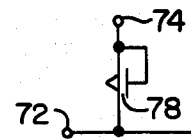
FIG._6B.
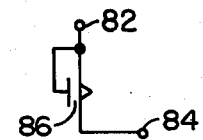
FIG._7A.
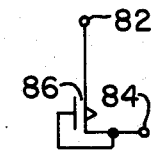
FIG._7B.
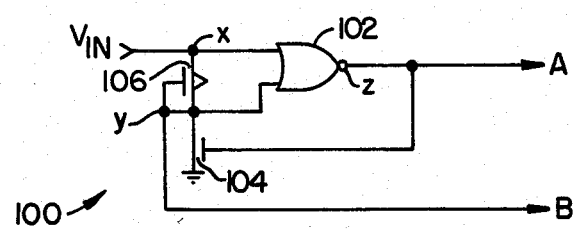
FIG._8.

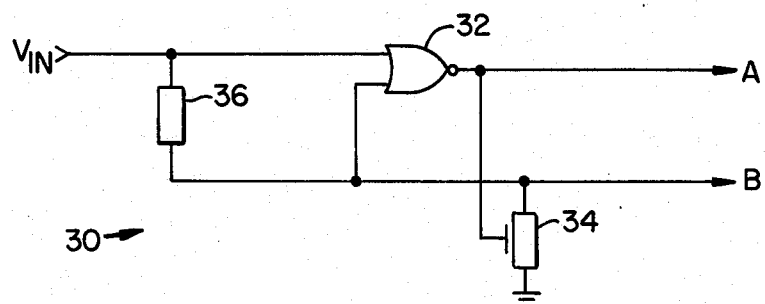
FIG._2.
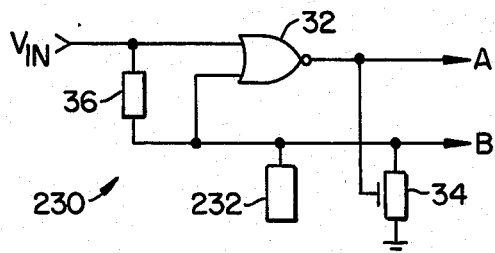
FIG._13A.
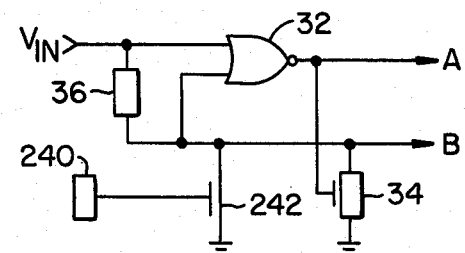
FIG._13B.
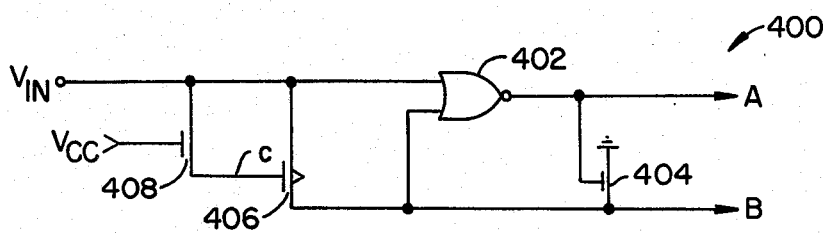
FIG._16.

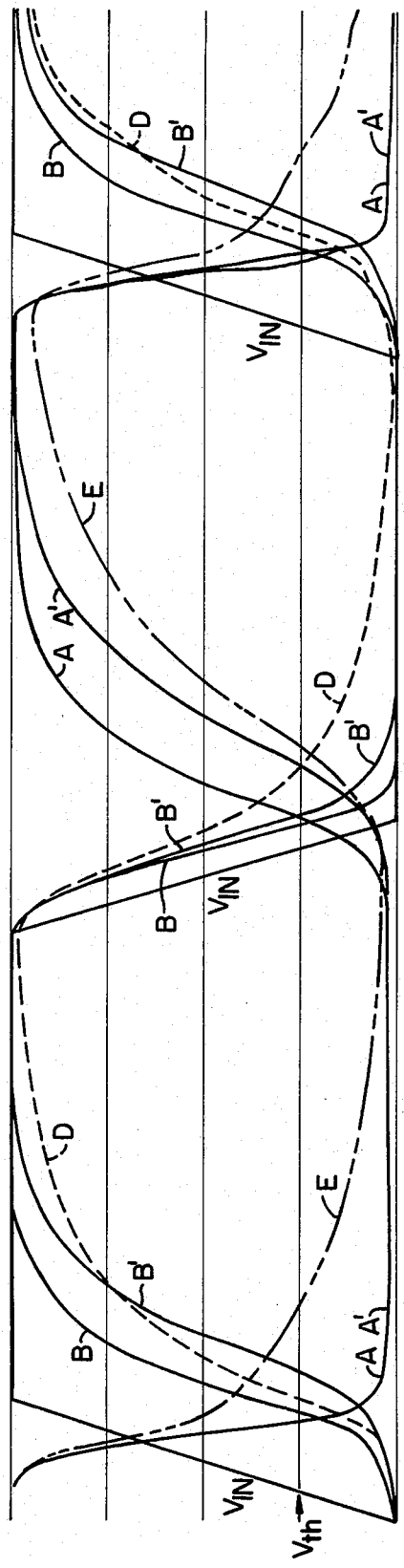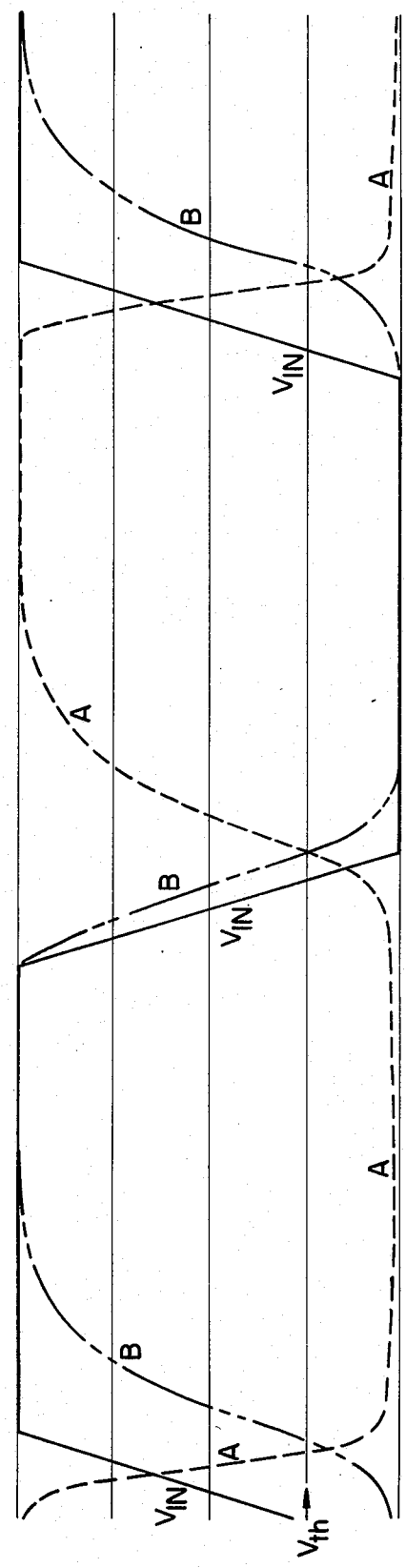

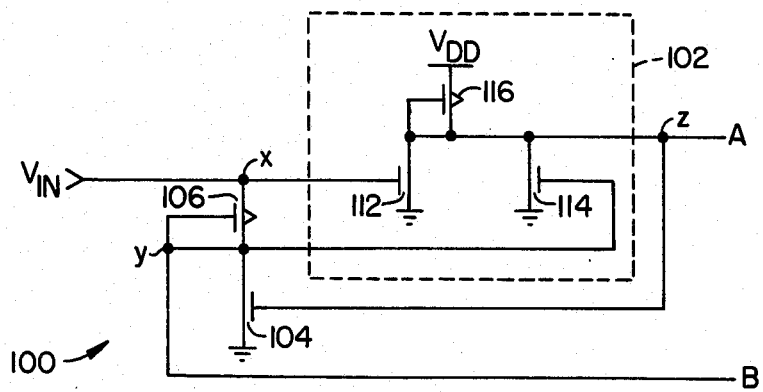
FIG._9.
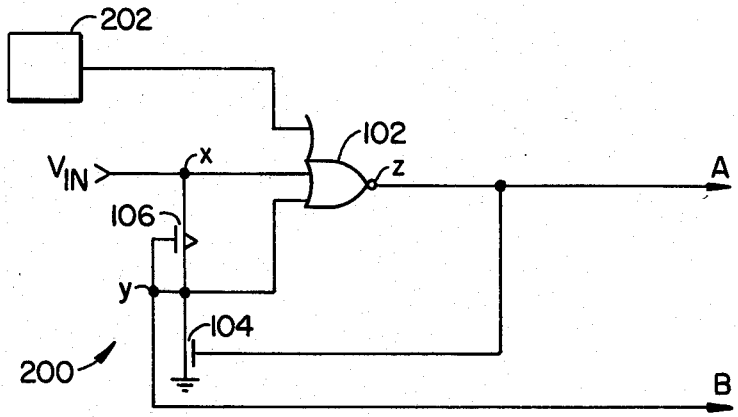
FIG._11.
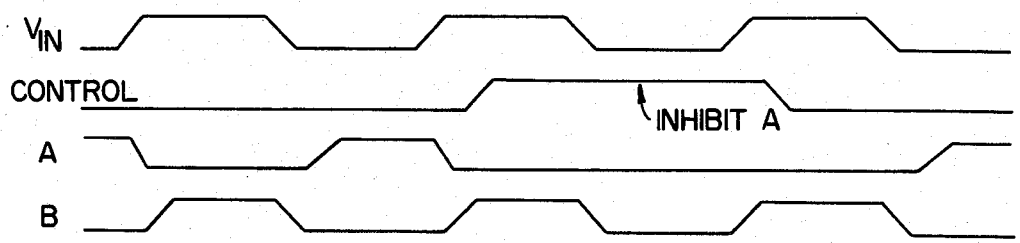
FIG._12.

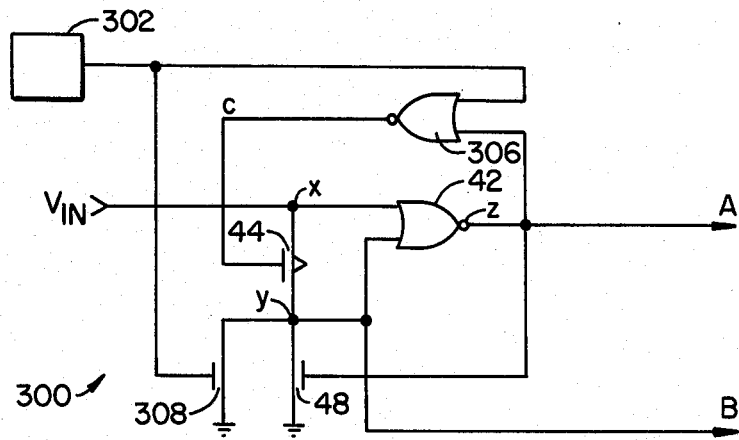
FIG.__14.
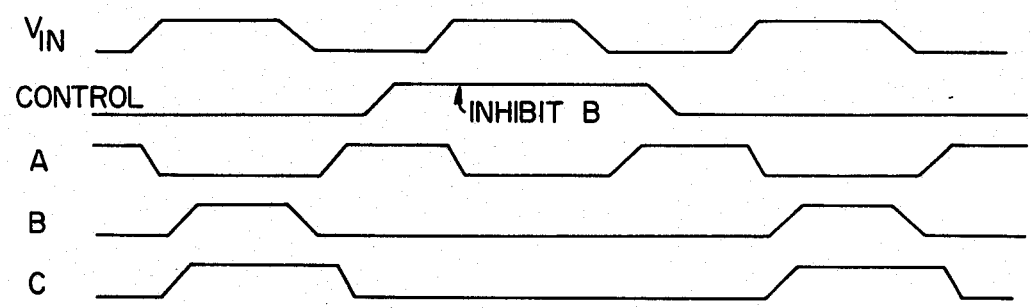
FIG.__15.

CLOCK GENERATOR FOR PROVIDING NON-OVERLAPPING CLOCK SIGNALS

BACKGROUND OF THE INVENTION

This invention relates in general to logic clock circuits and more particularly to non-overlap clocks.

Non-overlap clock circuits are very important for large scale integrated circuits constructed from MOS devices. Non-overlap clocks are used extensively to prevent glitches in dynamic circuits. One commonly used non-overlap circuit is shown in FIG. 1. As shown in FIG. 1, non-overlap clock circuit 20 comprises two NOR-gates 22, 24 and inverter 26 connected as shown. The output non-overlap clock signals are provided at outputs A, B. The output signal at B follows the input signal Vin. The output signal at A, however, follows Vin in opposite phase. Thus, when Vin goes up node A and node 28 go low following which node B goes high. When Vin goes low, node 28 goes high. This forces node B to go low which in turn causes node A to go high. The non-overlap circuit of FIG. 1 is disadvantageous in that node A goes high after one and one-half pair delay after Vin goes low. Such delay is quite a penalty for obtaining non-overlap clock signals which do not simultaneously exceed a predetermined level.

In U.S. Pat. No. 4,296,339 Murotani discloses an address inverter for producing, in response to a variable address input signal, a first and a second output signal. The first output signal varies with phase opposite to that of the address signal. The second output signal varies in phase with the address signal. The variable address binary signal is applied to a first inverter for inverting the signal and then through a first buffer circuit to produce the first output signal of opposite phase to the input address signal. The input address signal is also applied to a second inverter for inverting the signal and to a second buffer circuit which inverts the signal again to produce the second output signal in phase with the input address signal. The second inverter is made to vary faster than the first inverter. As a result the second output signal follows the input address signal faster than the first inverter so that the second output signal follows the input address signal faster than the first output signal. This prevents the two output signals from simultaneously having levels lower than a predetermined level. In many large scale integrated circuits, however, it is desirable to generate two non-overlap clock signals which are such that both output signals will not simultaneously have levels higher than a predetermined level. Thus, Murotani achieves a result which is opposite to that desired in such large scale integrated circuits.

Gehrig in U.S. Pat. No. 4,045,685 discloses an MOS power stage of a two-stage phase clock circuit generator for reducing power lost. An input square wave signal drives a binary frequency divider stage. The two outputs of the frequency divider controls the gates of two transistors. The MOS power stage comprises one MOSFET inverter. The main current paths of the two transistors are each coupled at one end to the output of the power inverter; the other ends of the transistor main current paths form the two outputs of the power stage. The two-phase clock circuit disclosed by Gehrig, however, produces non-overlap clock signals of frequency equal to half the frequency of the input square wave signal. In many large scale integrated circuit applications it is desirable to provide non-overlap signals with frequency equal to that of an input signal.

It is therefore desirable to provide a non-overlap circuit which provides two non-overlapping output signals with the same frequency as a variable input signal where the rise times of the output signals are not excessively delayed.

SUMMARY OF THE INVENTION

The circuit of this invention is responsive to a variable input signal for producing a first and a second output signal that vary respectively with phases opposite to and the same as the input signal. The circuit comprises a NOR-gate with its first input connected to the variable signal input and its second input to the second signal output of the circuit. The output of the NOR-gate is the first siganl output of the circuit. The circuit includes a first means having a gate and a main current path, where the gate is supplied with the first output signal of the circuit and the main current path connected between ground and the second signal output of the circuit. A second means is also employed with its main current path connected between the variable signal input and the second signal output of the circuit so that the second signal output of the circuit is driven by the variable input signal through the main current path of the second means.

The rise in level of either one or both outputs of the circuit may be delayed to increase the area of non-overlap between the two output signals. Either one or both output signals may also be inhibited from rising in level by a control means.

BRIEF DESCRIPTION OF THE DRAWINGS

FIG. 1 is a schematic circuit diagram of a prior art non-overlap clock circuit.

FIG. 2 is a schematic circuit diagram of a non-overlap clock circuit to illustrate this invention.

FIG. 3 is a schematic circuit diagram of a non-overlap clock circuit to illustrate the preferred embodiment of this invention.

FIG. 4 is a schematic circuit diagram of the non-overlap clock circuit of FIG. 3 wherein the logic components of the circuit comprise FET components.

FIG. 5 is a timing diagram illustrating the non-overlap clock signals for the circuit of FIG. 4 and for two modified versions thereof.

FIGS. 6A and 6B are schematic circuit diagrams of two delay circuits for delaying one of the output clock signals for the circuit of FIG. 4.

FIG. 7A and 7B are schematic circuit diagrams of two delay circuits for delaying the other output signal of the circuit of FIG. 4.

FIG. 8 is a schematic circuit diagram for a non-overlap clock circuit illustrating an alternative embodiment of this invention.

FIG. 9 is a schematic circuit diagram of the non-overlap clock circuit of FIG. 8 wherein the logic device of FIG. 8 comprises FET's.

FIG. 10 is a timing diagram of the outward clock signals of the circuit of FIG. 9.

FIG. 11 is a schematic circuit diagram of a non-overlap clock circuit of the type shown in FIG. 9 where one of the output signals can be inhibited by a control means.

FIG. 12 is a timing diagram illustrating the output clock signals of the circuit of FIG. 11.

FIG. 13A is a schematic circuit diagram of the non-overlap circuit of FIG. 2, where one of the output signals can be inhibited by a control means.

FIG. 13B is schematic circuit diagram of the circuit of FIG. 13A where the control means comprises an enhancement type FET controlled by a signal control means.

FIG. 14 is a schematic circuit diagram of a non-overlap clock circuit of the type shown in FIG. 3 where one of the output signals is inhibited by a control means.

FIG. 15 is a timing diagram illustrating the output clock signals for the circuit of FIG. 14.

FIG. 16 is a schematic circuit diagram of a non-overlap clock illustrating a second alternative embodiment of this invention.

DETAILED DESCRIPTION OF THE PREFERRED EMBODIMENT

FIG. 2 is a schematic circuit diagram of a non-overlap clock circuit 30 illustrating this invention. As shown in FIG. 2, clock circuit 30 includes a NOR-gate 32 with the variable input Vin supplied to one of its inputs. The output of the NOR-gate forms also the output of the clock circuit 30 at node A. The other input of the NOR-gate is connected to the second output B of the clock circuit output. The clock circuit includes a first and a second circuit means 34, 36. Circuit means 34 has a gate and main current path where the main current path is connected between ground and output B and the gate to output A so that when the output A is high, the main current path of the circuit means 34 conducts causing the output B to be low. The second circuit means 36 has a main current path connected between the variable signal input Vin and the output B. Output B is therefore driven by the variable input signal through the main current path of the circuit means 36.

When Vin is high, output A is driven low. This causes the main current path of circuit means 34 to be non-conducting so that output B can go high. Vin then drives output B high through the second circuit means 36. When Vin is low, output B discharges through the Vin input so that both inputs to the NOR-gate 32 are low, causing output A to go high. This in turn causes the main current path of the first means 34 to be conducting so that output B stays low.

The first and second circuit means 34, 36 can be any of a number of devices, some of which are described below. It will be understood that any two devices which have the above-described functions can be used and are within the scope of this invention.

FIG. 3 is a schematic circuit diagram of a non-overlap clock circuit 40 to illustrate the preferred embodiment of this invention. In the preferred embodiment, the first circuit means (of FIG. 2) is an enhancement type FET 48 and the second circuit means (of FIG. 2) includes a depletion type FET 44. As shown in FIG. 3 the variable input signal Vin is applied at X to the first input of a NOR-gate 42 through the main current path of a depletion type FET 44 to the second input of the NOR-gate Y. The output of the NOR-gate 42 at Z is the first output A of the circuit 40. Node B connected to Y provides the second output of the circuit 40. The output signal at node A is fed back through an inverter 46 to the gate of FET 44. The output signal at node A is also applied to the gate of an enhancement type FET 48 whose main current path is connected between node B and ground.

When Vin goes high node A goes low pinching off FET 48 and following which node C goes high so that Vin charges node B high. When Vin goes low node B discharges immediately and node A goes high. In one implementation of the clock circuit 40 in FIG. 3 there is an overall improvement over the prior art circuit of FIG. 1. The main advantage of the circuit in FIG. 3 is that node A goes high only half a pair delay from the time that Vin goes low. This results in a significant reduction in delay time for the rise of node A. The rise time of node B is also reduced since node B is driven directly from Vin. Since node C is very lightly loaded it can switch from low to high without a high power consumption. When Vin goes low node B discharges quickly through FET 44 thereby reducing the time required for node B to go from high to low.

In the above description, the rise time of node A is the time interval between the time when Vin falls to 10% of the magnitude of its high value and the time when node A rises to 90% of the magnitude of its high value. The fall time of node A is the time interval between the time when Vin rises to 90% of the magnitude of its high value and the time when node A falls to 10% of the magnitude of its high value. The rise and fall times of node B are defined in a similar manner.

FIG. 4 is a schematic circuit diagram of the non-overlap clock circuit of FIG. 3 wherein the logic components of the circuit (the NOR-gate and the inverter) comprise FET components. As shown in FIG. 4, NOR-gate 42 comprises two enhancement type FET's 52, 54 with each of the main current paths connected between node Z (and therefore also node A) and ground. The gate of FET 52 is connected to Vin at X and the gate of FET 54 is connected to node Y and thus to node B. NOR-gate 42 further comprises a depletion type FET 56 with its main current path connected between a power supply VDD and node Z with its gate also connected to node Z. When either one or both of nodes X and Y are high, at least one of the two FET's 52, 54 is saturated, causing node A to go low. When both nodes X and Y are low, then the power supply VDD causes node Z to go high. Therefore, FET's 52, 54, 56 together function as a NOR-gate. Inverter 46 comprises a depletion type FET 62 with its main current path connected between a power supply VDD and node C with its gate also connected to node C. Inverter 46 also comprises an enhancement type FET 64 with its main current path connected between node C and ground and its gate connected to node Z. Thus, when node Z is high it causes FET 64 to be saturated which in turn pulls node C to ground. When node Z is low, FET 64 is pinched off so that node C is charged by power supply VDD to high. In such manner FET's 62 and 64 in the above configuration form an inverter.

Thus when Vin is high it saturates FET 52 and causes node A to be pulled down to ground. This causes FET's 64 and 48 to be pinched off and node C to go high. This turns on FET 44 and causes node B to go high. When Vin goes low, node B immediately discharges through FET 44 and also goes low, and both FET's 52 and 54 are pinched off. VDD charges through FET 56 and causes node A to rise. Thus the circuit of FIG. 3 produces two output signals at nodes A and B which do not overlap, with node A in opposite phase to and node B in phase with the input signal.

While the above composition of NOR-gate 42 and inverter 46 are advantageous since the entire non-overlap clock circuit can be constructed using MOS technology it will be obvious that other types of components other than FET's may be used for NOR-gate 42 and inverter 46. All such configurations are within the scope of this invention.

FIG. 5 is a timing diagram illustrating the rise and fall times of nodes A, B and C relative to those of Vin for the non-overlap clock circuit of FIG. 4 and for two modified versions thereof. The signals at nodes A, B and input signal Vin are labeled as A, B and Vin in FIG. 5. As is clear from Fig.5 the two clocks signals at nodes A and B do not overlap. With the circuit arrangement of FIG. 4 it is possible to prevent the output signals at nodes A and B from simultaneously having levels higher than a predetermined threshold level Vth. From FIG. 5, it is also apparent that the rise of nodes A and B are not delayed excessively. Thus, non-overlap clock signals can be generated without having to pay the penalty of delaying the rise times of nodes A and B by an excessive amount. Comparing the non-overlap clock circuits of FIGS. 1 and 4, it is apparent that such excessive delay is reduced in the circuit of FIG. 4 because fewer components are employed in the current paths of the circuit. When input voltage Vin goes from high to low, node B goes low almost immediately and node A has the delay of only one gate. When input signal Vin goes from low to high there is only one gate delay for node A and two for node B. Furthermore, the non-overlap clock circuits of FIGS. 3 and 4 consume less power than the prior art circuit of FIG. 1. The circuit of FIG. 3 employs only two power consuming devices instead of 3 as in FIG. 1. The total number of components in the circuit of FIG. 4 is seven as opposed to at least 8 in the circuit of FIG. 1.

It is important for the output signals in nodes A and B during overlap to be simultaneously below a threshold in many applications. For example, the clock turn on of a stage must be completely off before the next clock signal begins. In reference to FIG. 4, FET 48 causes the output in node B to remain low until the output in node A has fallen to below the threshold voltage. Similarly, FET 54 will hold the output in node A low until the signal level output in node B has fallen to below the threshold voltage. Thus FET's 48 and 54 insure that the output clock signals at nodes A and B do not overlap.

In certain applications it may be desirable to further delay the rise of the output signal in node A relative to the rise of the input signal Vin. To accomplish such a result the non-overlap clock circuit of FIG. 4 need only be modified slightly. Such modifications are shown in FIGS. 6A and 6B where the circuit connections in FIG. 4 between points 72, 74 and 76 are replaced by the circuit in FIG. 6A or that in FIG. 6B. Such circuit modifications essentially introduce an RC delay by including a depletion type FET 78 between node B and the gate of FET 54 as described above. In the modified circuit, FET 54 holds the output of node A low until the voltage at its gate goes low. When the signal level at node B falls the RC delay introduced by FET 78 causes the signal level at the gate of FET 54 to lag behind the signal in node B. This causes FET 54 to be conducting for a short time period after the signal in node B has fallen low. The rise of the signal level at node A is therefore further delayed. The rise in signal level in node B can be delayed also by a similar modification of the clock circuit of FIG. 4. By incorporating the delay circuit of FIG. 7A or that of FIG. 7B into FIG. 4 a depletion type FET 86 is added between points 82 and 84 of FIG. 4. The main current path of FET 86 is connected between points 82 and 84 with its gate connected to point 82 in FIG. 7A and to point 84 in FIG. 7B. Similarly, the rise of signal level in node B is further delayed relative to the fall in signal level in node A.

The effects of RC delay introduced by FET's 78 and 86 are illustrated by the dotted curves A' and B' of FIG. 5. Thus, as shown in FIG. 5 the RC delay introduced by FET 78 causes node D (the gate of FET 54) to be delayed relative to node B. This in turn delays the rise time of node A whose signal level is shown as curve A' in FIG. 5. Similarly the RC delay introduced by FET 86 causes the signal level at node E to be delayed relative to the signal level at node A. The rise of signal level at node B is therefore also further delayed.

FIG. 8 is a schematic circuit diagram for a non-overlap clock circuit illustrating an alternative embodiment of this invention. As shown in FIG. 8 the clock circuit 100 comprises a NOR-gate 102, an enhancement type FET 104 and a depletion type FET 106. In other words, referring to the general description of the invention in reference to FIG. 2, the first circuit means is the enhancement type FET 104 and the second circuit means the depletion type FET 106. The input signal Vin is applied to node X which is one of the inputs to the NOR-gate 102. The output of the NOR-gate Z provides one of the output signals of the clock circuit 100 at node A. The enhancement FET 104 has its main current path connected between node Y which is the second input to the NOR-gate and ground. The output signal at node A is applied to the gate of FET 104. The depletion type FET 106 has its main current path connected between nodes X and Y and its gate connected to node Y. Node Y then provides the second output signal of the clock circuit 100 at node B. When Vin is high node A goes low which causes FET 104 to be pinched off. This in turn releases node B so that its signal level can rise. Vin causes node B to go high through depletion type FET 106. When Vin goes low node B discharges immediately through FET 106 and node A goes high. FET 104 holds node B low until node A has gone low. In such a manner circuit 100 produces two non-overlap clock signals at node A and B from the variable input signal Vin.

FIG. 9 is a schematic circuit diagram of the non-overlap clock circuit of FIG. 8 wherein the NOR-gate comprises FET's. As shown in FIG. 9 NOR-gate 102 comprises a pair of enhancement type FET's 112 and 114 with the main current paths connected between node Z and ground. Vin is applied to the gate of FET 112 at node X. The output signal at node B is applied at node Y to the gate of FET 114. The NOR-gate 102 further comprises a depletion type FET 116 with its main current path connected between a power supply VDD and node Z and its gate also connected to node Z. A comparison of FIGS. 4 and 9 will show that NOR-gate 102 is similar to NOR-gate 42 of FIG. 4. Thus, FET 114 holds node A low until the output signal in node B has gone low. The timing diagram of the clock signals at nodes A and B relative to the input signal Vin is shown in FIG. 10. As shown in FIG. 10 the non-overlap clock circuit of FIG. 9 produces clock signals A and B with rise and fall times essentially the same as those produced by the non-overlap clock circuit 40 of FIG. 4. See FIGS. 5 and 10. Circuit 40 of FIG. 4, however, can be used in conjunction with circuits with more loads to achieve equivalent rise times. When the circuit 100 of FIG. 9 is used in conjunction with heavy loads, the phase relationship between the clock signals at nodes A and B may change so that the two may be caused to overlap. On the other hand, the circuit of FIG. 9 includes fewer components than that of FIG. 4 and therefore consumes less power. Therefore depending upon the loads to be used in conjunction with the clock circuits and power consumption considerations, the appropriate clock circuit may be selected.

FIG. 11 is a schematic circuit diagram of a non-overlap clock circuit of the type shown in FIG. 8 wherein the output signal at node A can be inhibited by a control means. As shown in FIG. 11 the clock circuit 200 is essentially the same as the clock circuit 100 of FIG. 8 except that a control signal from control means 202 is applied to NOR-gate 102 to inhibit the rise in output level at node A. The circuit components and nodes having the same functions are labeled by the same numbers and letters in the two Figs. FIG. 12 is a timing diagram illustrating the clock signals at nodes A and B relative to the control signal and the input signal Vin. When the control signal is high it inhibits the signal level at node A from going from low to high.

Inhibition of one or both outputs is possible not only with the non-overlap circuit of the FIG. 8 type, but is also possible with the more general configuration of FIG. 2, as illustrated in FIGS. 13A, 13B. As shown in FIG. 13A, non-overlap clock circuit 230 differs from circuit 30 of FIG. 2 only in that circuit 230 includes an additional control means 232 for inhibiting output B. Obviously a similar control means used instead of or in conjunction with control means 232 may be used to inhibit output A. When the control signal from control means 232 is high, the signal level at B is inhibited from going high. Control means 232 may comprise an enhancement type FET and a signal control means as shown in FIG. 13B. To inhibit output B, signal control means 240 applies a signal to the gate of enhancement type FET 242 whose main current path is connected between output B and ground. This causes output B to be pulled to ground irrespective of the state of Vin. Output A can be inhibited in a similar manner.

FIG. 14 is a schematic circuit diagram of a non-overlap clock circuit 300 similar to the clock circuit 40 of FIG. 3 except that the output signal at node B is inhibited by a control means. The circuit components and nodes having the same functions are identified by the same numbers of letters in the two Figs. Inverter 46 of FIG. 3 is replaced by a NOR-gate 306 of FIG. 14. An additional enhancement FET 308 is added, all as shown in FIG. 14. FIG. 15 is a timing diagram illustrating the clock signals relative to the control signal and the input signal for the circuit of FIG. 14.

First the circuit is described for the case where the control signal from control means 302 is low. When the control signal from control means 302 is at a low level it causes FET 308 to be pinched off so that essentially FET 308 can be ignored when the control signal is at a low level. When Vin is at a high level it forces node A to go low. When node A goes low it causes FET 48 to be pinched off so that node B rises to a high level through FET 44. When Vin falls to a low level at a time when the control signal is also low it causes node B to be discharged to low level immediately so that both nodes X and Y are at low levels thereby causing the output at node A to go high. When the control signal from control means 302 is at a low level the NOR-gate 306 acts essentially as an inverter between nodes A and C.

Next assume that the control signal is at a high level. When the control signal from control means 302 is at a high level it saturates FET 308 thereby pulling down the signal level at node B at all times irrespective of the signal level of Vin. When the control signal is high, node C remains low irrespective of the state of node A. Node Y will always be at a low level when the control signal is at a high level. NOR-gate 42 acts as an inverter so that node A follows Vin in opposite phase.

FIG. 16 is a schematic circuit diagram of a non-overlap clock circuit illustrating a second alternative embodiment of the invention. Circuit 400 comprises a NOR-gate 402, an enhancement type FET 404, a depletion type FET 406 and a second enhancement or depletion type FET 408. A comparison of FIGS. 8 and 16 will reveal that NOR-gate 402, FET's 404, 406 are equivalent to NOR-gate 102 and FET's 104, 106 except that the gate of FET 406, instead of being connected to output B, forms one end of the main current path of an additonal FET 408. The other end of the main current path is connected to the variable signal input. The gate of FET 408 is controlled by a voltage VCC which can be constant or variable. The circuit of FIG. 16 may have a faster rise time for output B than the circuit of FIG. 8.

FET 408 can be either the enhancement or the depletion type. If it is the enhancement type, VCC should be a positive voltage.

In reference to FIG. 16, when Vin rises, node C is charged high through enhancement type FET 408 until its voltage reaches VCC-VTE, where VTE is the enhancement threshold voltage. At this point FET 408 is cut off, isolating the charge on node C from Vin. Meanwhile the rise in Vin has pulled node A low which pinches off FET 404 and allows node B to be charged through FET 406. As node B rises, the capacitive coupling between nodes B and C, caused by the gate of FET 406, pushes the voltage of node C up above VCC, so that the gate of FET 406 is at a higher voltage level than if it was tied to node B (as in FIG. 8). This causes FET 406 to be turned on harder, so that node B will have a faster rise time for a given size of FET 406.

The above description of circuit and method used is merely illustrated thereof. Various changes and components, connections or other details of the method and circuitry may be within the scope of the appended claims.

We claim:

1. A circuit responsive to a variable input signal for producing a first and a second output signal that vary respectively with phases opposite to and the same as said input signal, wherein the second output signal is inhibited by a control signal, said circuit comprising:

a first NOR-gate with a first input connected to the variable signal input and a second input to the second signal output of the circuit, the output of said NOR-gate supplying the first signal output of the circuit;

a first enhancement type FET whose gate is supplied with the first output signal of the circuit, the main current path of said enhancement type FET connected between said second signal output of the circuit and ground;

a depletion type FET whose main current path is connected between the variable input signal and the second signal output of the circuit;

a second NOR-gate with its two inputs connected to the first output of the circuit and the control signal and its output applied to the gate of the depletion type FET; and a second enhancement, type FET with its main current path connected between the second output of the circuit and ground and its gate controlled by the control signal.

* * * * *